(12) United States Patent
Huang et al.

(10) Patent No.: US 12,040,332 B1
(45) Date of Patent: Jul. 16, 2024

(54) ARRAY SUBSTRATE COMPRISING A TRANSPARENT FIRST SHIELDING LINE AND TRANSPARENT SECOND SHIELDING LINE DISPOSED BETWEEN THE TRANSPARENT FIRST SHIELDING LINE AND A DATA LINE AND DISPLAY PANEL

(71) Applicant: TCL CHINA STAR OPTOELECTRONICS TECHNOLOGY CO., LTD., Guangdong (CN)

(72) Inventors: Lei Huang, Guangdong (CN); Liu Yang, Guangdong (CN); Shumin Tang, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 18/332,418

(22) Filed: Jun. 9, 2023

(30) Foreign Application Priority Data

Dec. 31, 2022 (CN) .......................... 202211735379.1

(51) Int. Cl.
*H01L 27/12* (2006.01)
*G02F 1/1333* (2006.01)
*G02F 1/1343* (2006.01)
*G02F 1/136* (2006.01)
*G02F 1/1362* (2006.01)

(52) U.S. Cl.
CPC ...... *H01L 27/124* (2013.01); *G02F 1/134345* (2021.01); *G02F 1/134363* (2013.01); *G02F 1/13606* (2021.01); *G02F 1/136209* (2013.01); *G02F 1/136286* (2013.01); *G02F 1/133345* (2013.01); *G02F 1/136222* (2021.01)

(58) Field of Classification Search
CPC .................................................. G02F 1/13606
See application file for complete search history.

(56) References Cited

U.S. PATENT DOCUMENTS

| 2015/0268515 | A1* | 9/2015 | Seo | G02F 1/133788 |
| | | | | 438/30 |
| 2018/0129110 | A1* | 5/2018 | Syn | G02F 1/134336 |

* cited by examiner

*Primary Examiner* — Paul C Lee
(74) *Attorney, Agent, or Firm* — PV IP PC; Zhigang Ma; Wei Te Chung

(57) ABSTRACT

An array substrate and a display panel are provided. The array substrate includes a substrate, a common electrode line, a data line, a pixel electrode, and a shielding line. The common electrode line is disposed on the substrate. The data line is disposed on the common electrode line. The pixel electrode is disposed on the data line. The shielding line is disposed on the data line and includes a first shielding line and a second shielding line connected. The first shielding line and the pixel electrode are disposed in a same layer, and the second shielding line is disposed between the first shielding line and the data line. An orthographic projection of the first shielding line and the second shielding line on the substrate covers an orthographic projection of the data line on the substrate.

20 Claims, 3 Drawing Sheets

ARRAY SUBSTRATE COMPRISING A TRANSPARENT FIRST SHIELDING LINE AND TRANSPARENT SECOND SHIELDING LINE DISPOSED BETWEEN THE TRANSPARENT FIRST SHIELDING LINE AND A DATA LINE AND DISPLAY PANEL

CROSS-REFERENCE TO RELATED APPLICATION

This application claims priority to and the benefit of Chinese Patent Application No. 202211735379.1, filed on Dec. 31, 2022, the disclosure of which is incorporated herein by reference in its entirety.

TECHNICAL FIELD

The present application relates to display technologies, and in particular, to an array substrate and a display panel.

BACKGROUND

For liquid crystal display (LCD) panels in related technologies, a transparent shielding electrode line between a data line and a pixel electrode is configured to replace a data shielding line (DBS) disposed on a same layer as the pixel electrode for shielding the data line, so as to improve a penetration rate of the pixel electrode. The transparent shielding electrode line and the pixel electrode are not disposed in a same layer, a gap limitation between the transparent shielding electrode line and the pixel electrode for preventing short connection or crosstalk does not need to be considered, which is beneficial to increasing an area of the pixel electrode and improving the penetration rate of the pixel electrode. However, in this way, a distance from the transparent shielding electrode line to the data line is greater than a distance between the data shielding line and the data line, thereby increasing a parasitic capacitance between the transparent shielding electrode line and the data line, increasing a capacitive load of the data line, and reducing a charging efficiency.

Therefore, there is an urgent to provide an array substrate and a display panel to solve above technical problems.

SUMMARY

An array substrate and a display panel are provided by embodiments of the present application to solve technical problems that a data shielding line is replaced by a transparent shielding electrode line for shielding a data line, thereby increasing a parasitic capacitance between the transparent shielding electrode line and the data line, increasing a capacitive load of the data line, and reducing a charging efficiency.

To solve the problem mentioned above, technical solutions provided by the present application are as follows:

According to one embodiment of the present application, an array substrate includes a substrate, a common electrode line disposed on the substrate, a data line disposed on the common electrode line, a pixel electrode disposed on the data line, and a shielding line disposed on the data line. The shielding line includes a first shielding line and a second shielding line connected thereto. The first shielding line and the pixel electrode are disposed in a same layer, and the second shielding line is disposed between the first shielding line and the data line. An orthographic projection of the first shielding line and the second shielding line on the substrate covers an orthographic projection of the data line on the substrate.

According to one embodiment of the present application, the array substrate includes a pixel electrode area, a first wiring area disposed at a side of the pixel electrode area and extending along a first direction that is an extension direction of the data line, and a second wiring area disposed at another side of the pixel electrode area and extending along a second direction perpendicular to the first direction. The pixel electrode is located in the pixel electrode area, the shielding line is located in the first wiring area. The first shielding line is located at a side of the second wiring area, and the second shielding line is at least located at the side of the pixel electrode area.

According to one embodiment of the present application, in a top view, an overlapping part is disposed between the first shielding line and the second shielding line, and an orthographic projection of the overlapping part on the substrate are not overlapped with an orthographic projection of the pixel electrode on the substrate.

According to one embodiment of the present application, the overlapping part is located at the side of the second wiring area.

According to one embodiment of the present application, the array substrate includes a plurality of sub-pixel units with different colors sequentially arranged in the second direction and a plurality of overlapping parts corresponding to the plurality of sub-pixel units. Sides of the plurality of overlapping parts adjacent to pixel electrode areas of the plurality of sub-pixel units are flush.

According to one embodiment of the present application, the plurality of sub-pixel units include a first sub-pixel unit, a second sub-pixel unit, and a third sub-pixel unit arranged in the second direction. The plurality of overlapping parts include a first overlapping part, a second overlapping part, and a third overlapping part arranged in the second direction. The first overlapping part is located at a side of the first sub-pixel unit away from the second sub-pixel unit, the second overlapping part is located at a side of the second sub-pixel unit away from the third sub-pixel unit, and the third overlapping part is located at a side of the third sub-pixel unit adjacent to the second sub-pixel unit. In the first direction, a distance from the first overlapping part to the first sub-pixel unit is defined as d1, a distance from the second overlapping part to the second sub-pixel unit is defined as d2, and a distance from the third overlapping part to the third sub-pixel unit is defined as d3; d1 is greater than d2 and d3.

According to one embodiment of the present application, in the second direction, a width of the second shielding line is greater than a width of the first shielding line.

According to one embodiment of the present application, an orthographic projection of the pixel electrode on the substrate overlaps the orthographic projection of the data line on the substrate.

According to one embodiment of the present application, the array substrate includes a gate insulating layer covering a side of the common electrode line away from the substrate, an insulating dielectric layer covering a side of the data line away from the substrate, and a leveling layer covering a side of the second shielding line away from the substrate. The data line is disposed on a side of the gate insulating layer away from the substrate. The second shielding line is disposed on a side of the insulating dielectric layer away from the substrate. The first shielding line and the pixel electrode are disposed on a side of the leveling layer away from the data line. The first shielding line is electrically connected to the common electrode line through a first via hole going through the gate insulating layer, the insulating dielectric layer, and the leveling layer. The second shielding line is electrically connected to the common electrode line through a second via hole going through the gate insulating layer and the insulating dielectric layer.

According to one embodiment of the present application, the insulating dielectric layer includes a passivation layer covering the side of the data line away from the substrate and a color filter layer disposed on a side of the passivation layer away from the substrate. The color filter layer includes a color filter opening disposed in the second wiring area. The first via hole and the second via hole are located in the color filter opening.

According to one embodiment of the present application. The display panel includes the array substrate mentioned above, an opposite substrate, and a liquid crystal layer disposed between the array substrate and the opposite substrate.

The array substrate and the display panel are provided. The shielding line for shielding the data line includes the first shielding line and the second shielding line disposed in different layers. The first shielding line is disposed in the same layer as the pixel electrode, and the second shielding line is located between the data line and the first shielding line. The second shielding line is transparent and disposed in different layers with the pixel electrode, there is no gap limitation between the transparent shielding electrode line and the pixel electrode. At a same time, in a thickness direction of the array substrate, a vertical interlayer distance from the second shielding line to the data line is less than a vertical interlayer distance between the first shielding line to the data line, so that a parasitic capacitance between the data line and the shielding line may be reduced, a charging efficiency may be improved, a power of the data line may be reduced, and a serious heating problem of a flip-chip film may be improved.

BRIEF DESCRIPTION OF THE DRAWINGS

To describe technical solutions of embodiments of the present application more clearly, the following briefly introduces accompanying drawings used in the description of the embodiments of the present application. The accompanying drawings described below illustrate only some exemplary embodiments of the present application, and persons skilled in the art may derive other drawings from the drawings without making creative efforts.

DETAILED DESCRIPTION

Figure 1:
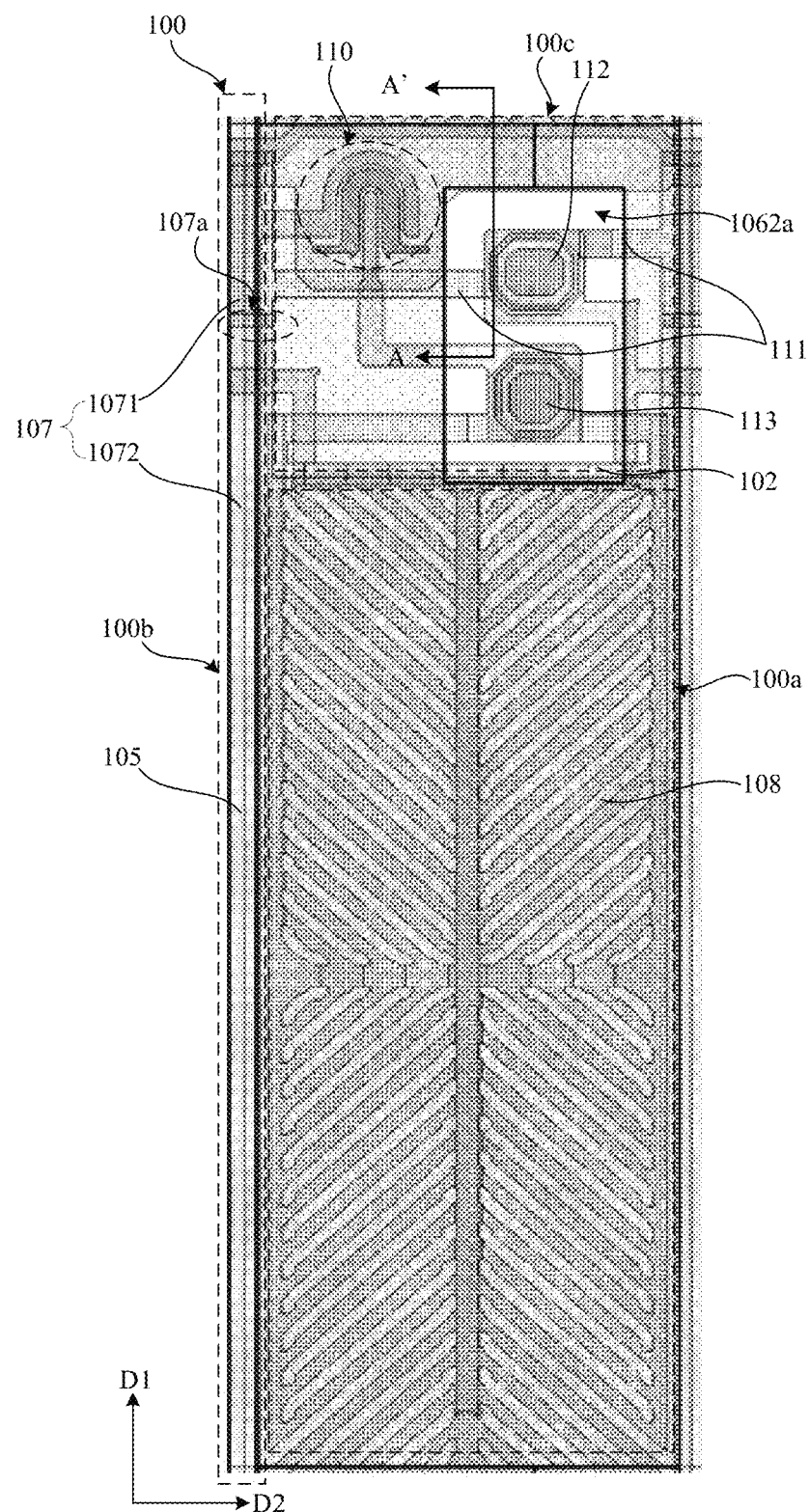
FIG. 1 is a plan structural diagram of an array substrate provided by an embodiment of the present application.

The technical solutions in embodiments of the present application will be described clearly and completely hereafter with reference to the accompanying drawings. Apparently, the described embodiments are merely a part of but not all embodiments of the present application. All other embodiments obtained by persons of ordinary skill in the art based on the embodiments of the present application without creative efforts shall fall within the protection scope of the present application. In addition, it should be understood that specific embodiments described herein are merely for explaining the present application, the term "embodiment" used in a context means an example, instance, or illustration, and the present application is not limited thereto. In the present application, location terms such as "up" and "down" are used in general to refer to up and down in actual use or operation of a device, in particular drawing directions in the drawings, without description to the contrary. While "inside" and "outside" are for the outline of the device.

Figure 2:
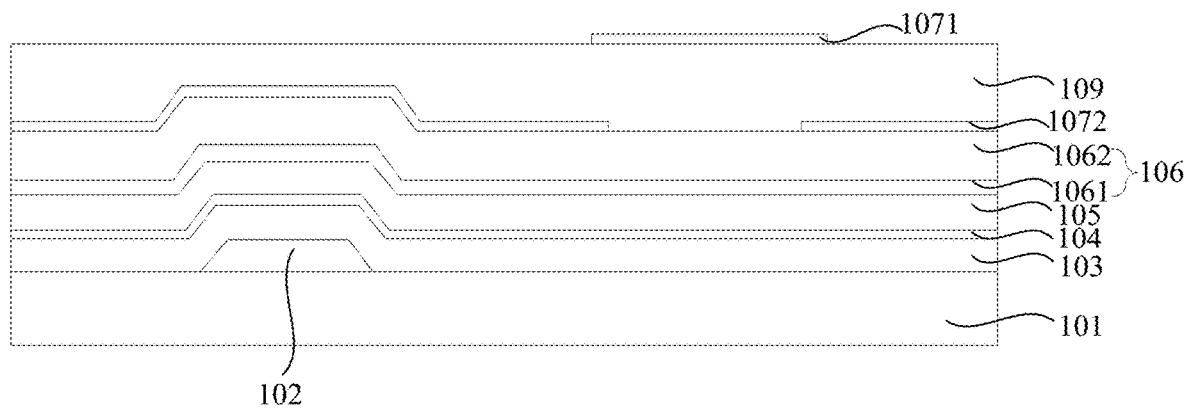
FIG. 2 is a sectional structural diagram along a section line A-A' in FIG. 1.

Referring to FIG. 1 and FIG. 2, an embodiment of the present application provides an array substrate 1 including a plurality of sub-pixel units 100. Each of the plurality of sub-pixel units 100 includes a pixel electrode area 100a, a first wiring area 100b, and a second wiring area 100c. The first wiring area 100b is disposed adjacent to the pixel electrode area 100a and the second wiring area 100c in a second direction D2. The second wiring area 100c is disposed adjacent to the pixel electrode area 100a in a first direction D1. The first direction D1 is an extension direction of a data line 105, and the second direction D2 is perpendicular to the first direction D1.

The array substrate 1 includes a substrate 101, a common electrode line 102, a data line 105, a pixel electrode 108, and a shielding line 107. The common electrode line 102 is disposed on the substrate 101. The data line 105 is disposed on the common electrode line 102 and located in the first tracing area 100b. The data line 105 is insulated from the common electrode line 102. The pixel electrode 108 is insulated and disposed on the data line 105 and located in the pixel electrode area 100a. The shielding line 107 is disposed on the data line 105 and located in the first wiring area 100b. The shielding line 107 includes a first shielding line 1071 and a second shielding line 1072. The first shielding line 1071 and the pixel electrode 108 are in a same layer, and the second shielding line 1072 is disposed between the first shielding line 1071 and the data line 105.

In an embodiment of the present application, the first shielding line 1071 is located on a side of the second wiring area 100c, and the second shielding line 1072 is located on another side of the pixel electrode area 100a. An orthographic projection of the first shielding line 1071 and the second shielding line 1072 on the substrate 101 covers an orthographic projection of the data line 105 on the substrate 101.

It should be noted that a principle of controlling a potential of liquid crystals by using a data shielding line (DBS) for shielding light is as follows: The shielding line 107 and a color film (CF) common electrode of a CF substrate disposed opposite to the array substrate 1 are applied a same common potential. There is no voltage difference between the shielding line 107 and the CF common electrode, so that the liquid crystals sandwiched between the shielding line 107 and the CF common electrode do not rotate regardless of what voltage signal is applied to the pixel electrode 108. The liquid crystals do not rotate, it means that a phase of polarized light does not change. In a liquid crystal display in a normal black mode, the polarized light passing through a first polarizer may not pass through a second polarizer, so the shielding line 107 may play a role equivalent to black matrixes for shielding light, and the shielding line 107 may replace the black matrixes. Furthermore, this design has an advantage that when the display panel is curved to form a curved display, even if upper and lower substrates are dislocated, a position of the shielding line 107 relative to the data line 105 may not change, thereby preventing a problem of light leakage and mura (poor display).

It may be understood that the shielding line 107 for shielding the data line 105 includes the first shielding line 1071 and the second shielding line 1072 disposed in different layers in the present application, and the second shielding line 1072 is located on the side of the pixel electrode area 100a. The second shielding line 1072 is transparent and disposed in a different layer from the pixel electrode 108, there is no need to consider a possibility of a short circuit between the second shielding line 1072 and the pixel electrode 108, and there is no gap limitation therein. The pixel electrode 108 may extend in a direction adjacent to the data line 105, and an area of the pixel electrode area 100a is increased, thereby improving a penetration rate.

At the same time, the first shielding line 1071 is located on a side of the second wiring area 100c. A reason for this arrangement is that: in a first aspect, since the pixel electrode 108 is not provided in the second wiring area 100c, the pixel electrode 108 may not extend to the second wiring area 100c, and a part of the shielding line 107 located on the side of the second wiring area 100c does not need to be disposed on the same layer as the second shielding line 1072. In a second aspect, since the second shielding line 1072 is located between the first shielding line 1071 and the data line 105, a vertical interlayer distance from the second shielding line 1072 to the data line 105 is less than a vertical interlayer distance from the first shielding line 1071 to the data line 105 in a thickness direction of the array substrate 1.

In view of the second aspect, it should be noted that according to a calculation formula of the capacitance value: $c=\varepsilon s/4\pi k d$, $\varepsilon$ is defined as a dielectric constant of an intermediate medium, s is defined as an effective opposite area of two plates, $\pi$ and k are defined as constants, and d is defined as a distance between the two plates. It may be seen that the capacitance value is generally related to the effective positive area between the two plates, the spacing between the two plates, and the dielectric constant of the medium between the two plates. The capacitance value is positively related to the effective positive area between the two plates and negatively related to the spacing between the two plates. Therefore, when other parameters are fixed, the smaller the spacing d between the two plates, and the larger the capacitance value. That is, a capacitance value between the second shielding line 1072 and the data line 105 is greater than a capacitance value between the first shielding line 1071 and the data line 105. In other words, if the whole electrode line disposed in the same layer as the pixel electrode 108 is replaced by the second shielding line 1072, the capacitance between the shielding line 107 and the data line 105 is increased, so that a capacitance load of the data line 105 is increased, which is not conducive to improving a charging efficiency, and a power of the data line 105 is increased, chip on films (COF) for providing data signals to the data line 105 may be seriously heated or even burnt out.

In this present application, the shielding line 107 adopts a way that the first shielding line 1071 and the second shielding line 1072 are disposed alternately. Compared that the whole electrode line disposed in the same layer as the pixel electrode 108 is replaced by the second shielding line 1072, a capacitance deterioration between the shielding line 107 and the data line 105 is improved, the charging efficiency is improved, and the power of the data line 105 is reduced. Therefore, in the embodiment of the present application, neither the whole shielding lines 107 are electrode lines disposed in the same layer as the pixel electrode 108 nor the second shielding lines 1072, so that both requirements of the penetration rate of the pixel electrode 108 and the capacitance load of the data line 105 may be simultaneously ensured.

Specifically, both a material of the first shielding line 1071 and a material of the pixel electrode 108 include any one of indium tin oxide (ITO), indium gallium zinc oxide (IGZO), and ITO/Ag/ITO laminated materials. it may be known that the material of the first shielding line 1071 and the material of the pixel electrode 108 include transparent conductive materials commonly used in the art.

Specifically, a material of the second shielding line 1072 includes any one of ITO, IGZO, and ITO/Ag/ITO laminated materials. It may be known that the material of the second shielding line 1072 further includes transparent conductive materials commonly used in the art.

In this embodiment, the array substrate 1 further includes a thin film transistor 110 located in the second wiring area 100c and a gate line extending along the second direction D2. The gate line and the data line 105 intersect to define the pixel electrode region 100a. The common electrode line 102 is disposed in a same layer as the gate electrode and the gate line of the thin film transistor 110, and both of which are located in the first metal layer. The data line 105 is disposed in a second metal layer, and disposed in the same layer as a source electrode and a drain electrode of the thin film transistor 110.

It should be noted that the common electrode line 102 and the CF common electrode are applied with a same voltage signal. The shielding line 107 in the embodiment of the present application is electrically connected with the common electrode line 102, so as to realize that the shielding line 107 and the CF common electrode have the same common potential. Specifically, in one embodiment, the first shielding line 1071 is electrically connected with the common electrode line 102, the second shielding line 1072 is connected with an external voltage signal, and a voltage of the external voltage signal and a voltage of the common electrode line 102 are same. In one embodiment, both the first shielding line 1071 and the second shielding line 1072 are electrically connected to the common electrode line 102. In one embodiment, the first shielding line 1071 is electrically connected to the common electrode line 102, and the first shielding line 1071 is electrically connected to the second shielding line 1072.

Considering a process error and accuracy, in a top view, there are difficulties that an end of the first shielding line 1071 adjacent to the second shielding line 1072 is just joined with an end of the second shielding line 1072 adjacent to the first shielding line 1071. Therefore, in this embodiment, an overlapping part 107a is disposed between the first shielding line 1071 and the second shielding line 1072 in the top view, so as to ensure that the data line 105 is completely covered by the first shielding line 1071 and the second shielding line 1072.

Furthermore, the pixel electrode 108 in this embodiment extends and enlarged in the direction adjacent to the data line 105, and an edge of the pixel electrode area 100a may be located in the first wiring area 100b. The pixel electrode 108 and the first shielding line 1071 are disposed in the same layer and manufactured by a same process, a spacing of a film formation pattern is necessary to be ensured, especially a safe distance between different electrodes in the same layer, so as to prevent the short circuit or crosstalk caused by a contact between the first shielding line 1071 and the pixel electrode 108. Therefore, in this embodiment, a certain distance is required from the first shielding line 1071 to the pixel electrode 108 in the first direction D1. In this embodiment, an orthographic projection of the overlapping part 107*a* on the substrate 101 is not overlapped with the orthographic projection of the pixel electrode 108 on the substrate 101 in the second direction D2, so as to prevent interference caused by the first shielding line 1071 on the pixel electrode 108.

Furthermore, the overlapping part 107*a* is located at a side of the second wiring area 100*c*, and a distance from the overlapping part 107*a* to the pixel electrode area 100*a* is greater than 0 in the first direction D1.

In this embodiment, a size of the overlapping part 107*a* in the first direction D1 may not be too large or too small. A reason for this arrangement is that: if the size is too large, an area of the second shielding line 1072 on the side of the second wiring area 100*c* is large, which is not conducive to improving the parasitic capacitance value between the shielding line 107 and the data line 105. If the size is too small, process accuracy in a related art may not be achieved, so that the shielding line 107 may not completely cover the data line 105. For example, according to experiments, the inventor of the present application obtains that the size of the overlapping part 107*a* in the first direction D1 ranges from 2 microns to 3 microns. For example, the size of the overlapping part 107*a* in the first direction D1 may be any one of 2 microns, 2.2 microns, 2.4 microns, 2.6 microns, 2.8 microns, and 3 microns. Certainly, the size of the overlapping part 107*a* in the first direction D1 should be adaptively set according to actual situations, which is not limited by the embodiment of the present application here.

In this embodiment, the orthographic projection of the pixel electrode 108 on the substrate 101 overlaps the orthographic projection of the data line 105 on the substrate 101, and the orthographic projection of the pixel electrode 108 on the substrate 101 is not overlapped with the orthographic projection of the data line 105 of the adjacent sub-pixel unit 100 on the substrate 101. Furthermore, the orthographic projection of the pixel electrode 108 on the substrate 101 coincides with the orthographic projection of the data line 105 on the substrate 101.

Figure 3:
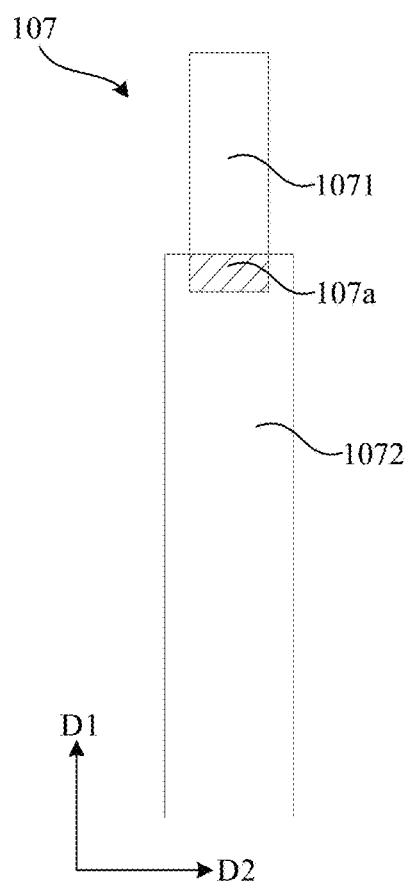
FIG. 3 is another plan structural diagram of the array substrate provided by an embodiment of the present application.

Referring to FIG. 3, in this embodiment, a width of the second shielding line 1072 is greater than a width of the first shielding line 1071 in the second direction D2. A reason for this arrangement is that: from above analysis of factors affecting the capacitance value, it may be seen that the capacitance value of the capacitor is positively correlated with the effective positive area between the two plates. And the pixel electrode 108 extends to overlap with the second shielding line 1072 in the top view, the positive area between the second shielding line 1072 and the pixel electrode 108 is increased by increasing the width of the second shielding line 1072 in the second direction D2, so that the storage capacitance between the second shielding line 1072 and the pixel electrode 108 is increased, and the charging efficiency is increased.

Figure 4:
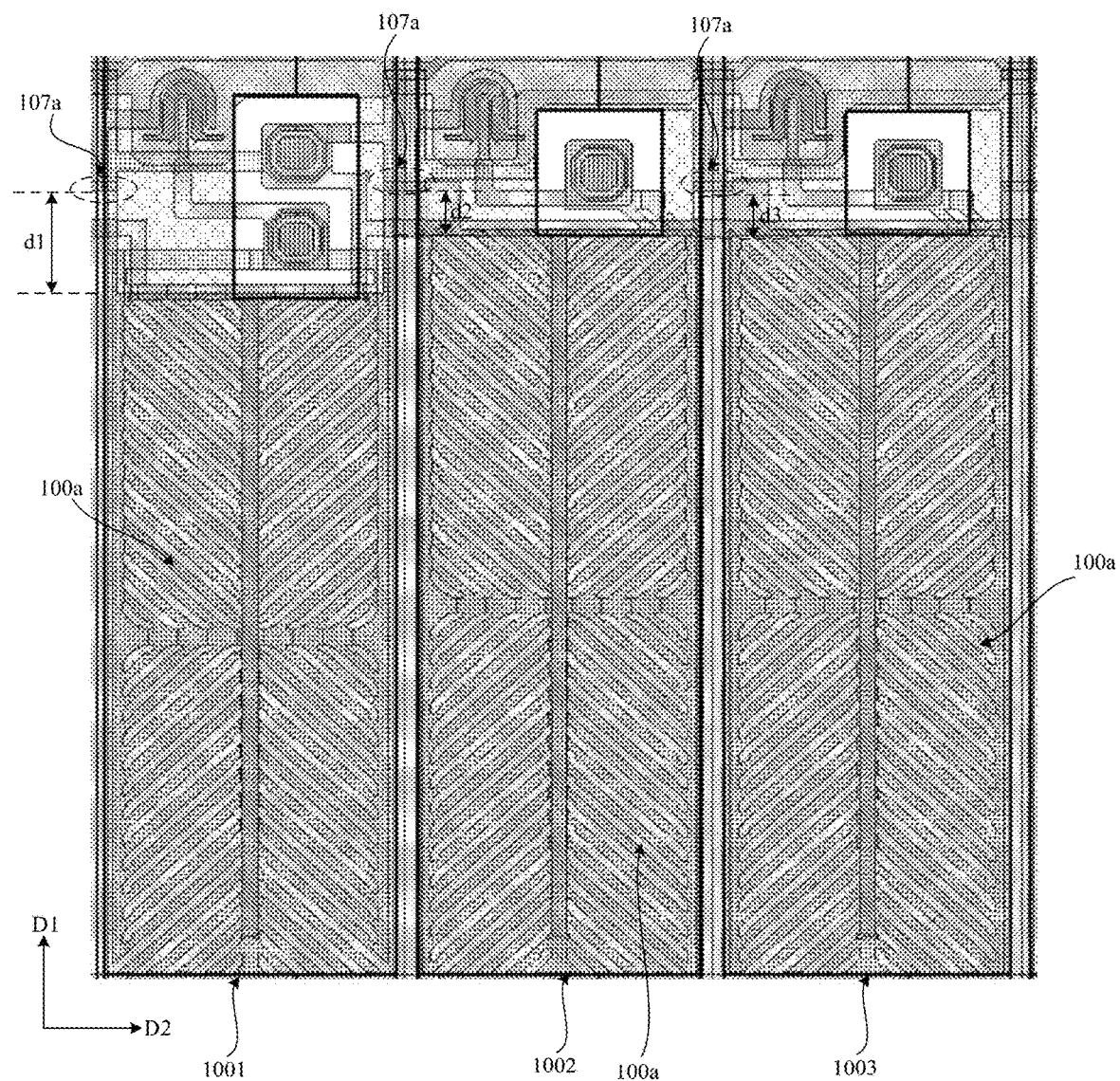
FIG. 4 is a plan structural diagram of a shielding line provided by an embodiment of the present application.

Referring to FIG. 4, in this embodiment, the plurality of sub-pixel units 100 with different colors are arranged sequencing in the second direction D2. Sides of the plurality of overlapping parts 107*a* adjacent to pixel electrode areas of the plurality of sub-pixel units 100 are flush in the second direction D2, so as to decrease difficulties of manufacturing the first shielding line 1071 and the second shielding line 1072.

Furthermore, the plurality of sub-pixel units 100 include a first sub-pixel unit 1001, a second sub-pixel unit 1002, and a third sub-pixel unit 1003 arranged in the second direction D2. An area of the pixel electrode area 100*a* of the first sub-pixel unit 1001 is less than an area of the pixel electrode area 100*a* of the second sub-pixel unit 1002, and the area of the pixel electrode area 100*a* of the first sub-pixel unit 1001 is less than an area of the pixel electrode area 100*a* of the third sub-pixel unit 1003. The area of the pixel electrode area 100*a* of the second sub-pixel unit 1002 is equal to the area of the pixel electrode area 100*a* of the third sub-pixel unit 1003. In the first direction D1, the first sub-pixel unit 1001 is away from the corresponding pixel electrode area 100*a* than the second sub-pixel unit 1002 and the third sub-pixel unit 1003.

Specifically, in this embodiment, the first sub-pixel unit 1001 may be a blue sub-pixel unit, the second sub-pixel unit 1002 may be one of a red sub-pixel unit and a green sub-pixel unit, and the third sub-pixel unit 1003 may be another one of the red sub-pixel unit and the green sub-pixel unit. Taking the first sub-pixel unit 1001 as the blue sub-pixel unit, the second sub-pixel unit 1002 as the red sub-pixel unit, and the third sub-pixel unit 1003 as the green sub-pixel unit as an example, the blue sub-pixel unit has lower luminous efficiency and shorter life than the red sub-pixel unit and the green sub-pixel unit, so an pixel electrode area of the blue sub-pixel unit in the embodiment of the present application is greater than an pixel electrode area of the red sub-pixel unit and an pixel electrode area of the green sub-pixel unit, so as to improve the uniformity of luminous efficiency of the sub-pixel units with different colors. That is, an edge of the blue sub-pixel unit adjacent to the corresponding second wiring area 100*c* protrudes upward from an edge of the pixel electrode area adjacent to the corresponding second wiring area 100*c* of other two colors. Considering the difficulties of manufacturing processes, sides of the overlapping parts 107*a* of sub-pixel units with different colors adjacent to the corresponding pixel electrode area needs to be manufactured on a same horizontal line. Therefore, in the embodiment of the present application, the overlapping part 107*a* of the blue sub-pixel unit is adjacent to the corresponding pixel electrode area 100*a* than the overlapping part 107*a* of the red sub-pixel unit and the green sub-pixel unit. Specifically, in the first direction D1, a distance from the overlapping portion 107*a* of the blue sub-pixel unit to the pixel electrode area 100*a* is d1, a distance from the overlapping part 107*a* of the red sub-pixel unit to the pixel electrode area 100*a* is d2, and a distance from the overlapping portion 107*a* of the blue sub-pixel unit to the pixel electrode area 100*a* is d3. d1 is greater than d2, and d2 is equal to d3.

Referring to FIG. 1 and FIG. 2, in this embodiment, the array substrate 1 further includes a gate insulating layer 103, an insulating dielectric layer 106, and a leveling layer 109. The gate insulating layer 103 covers a side of the common electrode line 102 away from the substrate 101. The gate insulating layer 103 is located on a side of the gate insulating layer 103 away from the substrate 101. The insulating dielectric layer 106 covers a side of the data line 105 away from the substrate 101. The second shielding line 1072 is disposed on a side of the insulating dielectric layer 106 away from the substrate 101. The leveling layer 109 covers a side of the second shielding line 1072 away from the substrate 101. The first shielding line 1071 and the pixel electrode 108 are disposed on a side of the leveling layer 109 away from the data line 105. The first shielding line 1071 is electrically connected to the common electrode line 102 through a first via hole 112 going through the gate insulating layer 103, the insulating dielectric layer 106, and the leveling layer 109. The second shielding line 1072 is electrically connected to the common electrode line 102 through a second via hole going through the gate insulating layer 103 and the insulating dielectric layer 106.

Furthermore, the array substrate 1 further includes a connecting line 111 disposed in the same layer as the pixel electrode 108. The connecting line 111 is configured to connect two first shielding lines 1071 on opposite sides of the second wring area 100c. The present application does not limit a specific arrangement of the connecting line 111, as long as the first shielding line 1071 is effectively conductive and does not interfere with other lines.

Furthermore, the insulating dielectric layer 106 includes a passivation layer 1061 and a color filter layer 1062. The passivation layer 1061 covers the side of the data line 105 away from the substrate 101. The color filter layer 1062 is disposed on a side of the passivation layer 1061 away from the substrate 101. The color filter layer 1062 includes a color filter opening 1062a provided in the second wiring area 100c, and both the first via hole 112 and the second via hole are located in the color filter opening 1062a.

Accordingly, the color filter layer 1062 includes a plurality of color filter units arranged corresponding to the plurality of sub-pixel units 100 for emitting light with corresponding colors. The plurality of the color filter units may include a red color filter unit, a green color filter unit, and a blue color filter unit. The array substrate 1 in the embodiment is a color on array (COA) substrate. That is, the color filter units are formed on the array substrate 1, which is beneficial to reduce color filter offset caused by alignment offset of the upper and lower substrates and simplify the manufacturing process of the CF substrate.

Specifically, the leveling layer 109 is a flexible organic layer (PFA), and the passivation layer 1061 is an inorganic layer.

It should be noted that the array substrate 1 further includes an active layer 104 disposed on the side of the gate insulating layer 103 away from the substrate 101. A material of the gate insulating layer 103 includes any one or more combinations of silicon nitride, silicon oxide, and silicon oxynitride. The gate electrode, the active layer 104, and the source electrode constitute the thin film transistor 110. The source electrode is electrically connected to the data line 105. The drain electrode is electrically connected to the pixel electrode 108 through a pixel via hole 11.

Figure 5:
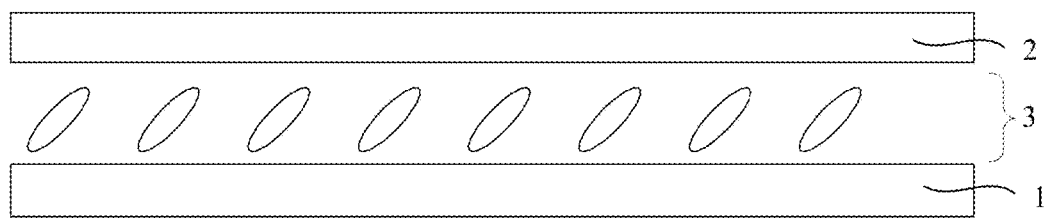
FIG. 5 is a cross-sectional structural diagram of a display panel provided by an embodiment of the present application.

Referring to FIG. 5, the embodiment of the present application further provides a display panel. The display panel is a liquid crystal display panel. The display panel includes the array substrate 1 in the above embodiments, an opposite substrate 2 disposed opposite to the array substrate 1, and a liquid crystal layer 3 disposed between the array substrate 1 and the opposite substrate 2.

Specifically, the opposite substrate 2 is the CF substrate. The opposite substrate 2 is provided with the CF common electrode. There is a voltage difference between the CF common electrode and the pixel electrode 108 on the array substrate 1, which may drive the liquid crystal molecules in the liquid crystal layer 3 to rotate to realize picture display. The opposite substrate 2 is further provided with the black matrixes. Certainly, the black matrixes may further be disposed on the array substrate 1.

Beneficial effects of the present application are that: The array substrate and the display panel are provided. The shielding line for shielding the data line includes the first shielding line and the second shielding line disposed in different layers. The first shielding line is disposed in the same layer as the pixel electrode, and the second shielding line is located between the data line and the first shielding line. The second shielding line is transparent and disposed in different layers with the pixel electrode, there is no gap limitation between the transparent shielding electrode line and the pixel electrode. At the same time, in the thickness direction of the array substrate, the vertical interlayer distance from the second shielding line to the data line is less than the vertical interlayer distance between the first shielding line to the data line, so that the parasitic capacitance between the data line and the shielding line may be reduced, the charging efficiency may be improved, the power of the data line may be reduced, and the serious heating problem of a flip-chip film may be improved.

The description about the foregoing embodiments is merely provided to help understand the method and core ideas of the present application. Persons of ordinary skill in the art should understand that they may still make modifications to the technical solutions described in the foregoing embodiments or make equivalent replacements to some or all technical features thereof, without departing from the scope of the technical solutions of the embodiments of the present application.

What is claimed is:

1. An array substrate, comprising:
   a substrate;
   a common electrode line, disposed on the substrate;
   a data line, disposed on the common electrode line;
   a pixel electrode, disposed on the data line; and
   a shielding line, disposed on the data line and comprising
      a first shielding line and a second shielding line connected thereto, wherein the first shielding line and the pixel electrode are disposed in a same layer, and the second shielding line is disposed between the first shielding line and the data line;
   wherein an orthographic projection of the first shielding line and the second shielding line on the substrate covers an orthographic projection of the data line on the substrate; both the first shielding line and the second shielding line are transparent.

2. The array substrate in claim 1, further comprising:
   a pixel electrode area;
   a first wiring area, disposed at a side of the pixel electrode area and extending along a first direction that is an extension direction of the data line; and
   a second wiring area, disposed at another side of the pixel electrode area and extending along a second direction perpendicular to the first direction;
   wherein the pixel electrode is located in the pixel electrode area, the shielding line is located in the first wiring area; the first shielding line is located at a side of the second wiring area, and the second shielding line is located at the side of the pixel electrode area.

3. The array substrate in claim 2, wherein in a top view, an overlapping part is disposed between the first shielding line and the second shielding line, and an orthographic projection of the overlapping part on the substrate are not overlapped with an orthographic projection of the pixel electrode on the substrate.

4. The array substrate in claim 3, wherein the overlapping part is located at the side of the second wiring area.

5. The array substrate in claim 4, further comprising a plurality of sub-pixel units with different colors sequentially arranged in the second direction and a plurality of overlapping parts corresponding to the plurality of sub-pixel units, wherein sides of the plurality of overlapping parts adjacent to pixel electrode areas of the plurality of sub-pixel units are flush.

6. The array substrate in claim 5, wherein the plurality of sub-pixel units comprise a first sub-pixel unit, a second sub-pixel unit, and a third sub-pixel unit arranged in the second direction; the plurality of overlapping parts comprise a first overlapping part, a second overlapping part, and a third overlapping part arranged in the second direction; the first overlapping part is located at a side of the first sub-pixel unit away from the second sub-pixel unit, the second overlapping part is located at a side of the second sub-pixel unit away from the third sub-pixel unit, and the third overlapping part is located at a side of the third sub-pixel unit adjacent to the second sub-pixel unit; and wherein in the first direction, a distance from the first overlapping part to the first sub-pixel unit is defined as d1, a distance from the second overlapping part to the second sub-pixel unit is defined as d2, and a distance from the third overlapping part to the third sub-pixel unit is defined as d3; d1 is greater than d2 and d3.

7. The array substrate in claim 2, wherein in the second direction, a width of the second shielding line is greater than a width of the first shielding line.

8. The array substrate in claim 7, wherein an orthographic projection of the pixel electrode on the substrate overlaps the orthographic projection of the data line on the substrate.

9. The array substrate in claim 2, further comprising:
a gate insulating layer, covering a side of the common electrode line away from the substrate, wherein the data line is disposed on a side of the gate insulating layer away from the substrate;
an insulating dielectric layer, covering a side of the data line away from the substrate, wherein the second shielding line is disposed on a side of the insulating dielectric layer away from the substrate; and
a leveling layer, covering a side of the second shielding line away from the substrate, wherein the first shielding line and the pixel electrode are disposed on a side of the leveling layer away from the data line;
wherein the first shielding line is electrically connected to the common electrode line through a first via hole going through the gate insulating layer, the insulating dielectric layer, and the leveling layer; the second shielding line is electrically connected to the common electrode line through a second via hole going through the gate insulating layer and the insulating dielectric layer.

10. The array substrate in claim 9, wherein the insulating dielectric layer comprises:
a passivation layer, covering the side of the data line away from the substrate; and
a color filter layer, disposed on a side of the passivation layer away from the substrate and comprising a color filter opening disposed in the second wiring area, wherein the first via hole and the second via hole are located in the color filter opening.

11. A display panel, comprising:
an array substrate;
an opposite substrate; and
a liquid crystal layer, disposed between the array substrate and the opposite substrate;
wherein the array substrate, comprising:
a substrate;
a common electrode line, disposed on the substrate;
a data line, disposed on the common electrode line;
a pixel electrode, disposed on the data line; and
a shielding line, disposed on the data line and comprising a first shielding line and a second shielding line connected thereto, wherein the first shielding line and the pixel electrode are disposed in a same layer, and the second shielding line is disposed between the first shielding line and the data line;
wherein an orthographic projection of the first shielding line and the second shielding line on the substrate covers an orthographic projection of the data line on the substrate; both the first shielding line and the second shielding line are transparent.

12. The display panel in claim 11, wherein the array substrate further comprises:
a pixel electrode area;
a first wiring area, disposed at a side of the pixel electrode area and extending along a first direction that is an extension direction of the data line; and
a second wiring area, disposed at another side of the pixel electrode area and extending along a second direction perpendicular to the first direction;
wherein the pixel electrode is located in the pixel electrode area, the shielding line is located in the first wiring area; the first shielding line is located at a side of the second wiring area, and the second shielding line is located at the side of the pixel electrode area.

13. The display panel in claim 12, wherein in a top view, an overlapping part is disposed between the first shielding line and the second shielding line, and an orthographic projection of the overlapping part on the substrate are not overlapped with an orthographic projection of the pixel electrode on the substrate.

14. The display panel in claim 13, wherein the overlapping part is located at the side of the second wiring area.

15. The display panel in claim 14, wherein the array substrate further comprises a plurality of sub-pixel units with different colors sequentially arranged in the second direction and a plurality of overlapping parts corresponding to the plurality of sub-pixel units, wherein sides of the plurality of overlapping parts adjacent to pixel electrode areas of the plurality of sub-pixel units are flush.

16. The display panel in claim 15, wherein the plurality of sub-pixel units comprise a first sub-pixel unit, a second sub-pixel unit, and a third sub-pixel unit arranged in the second direction, the plurality of overlapping parts comprise a first overlapping part, a second overlapping part, and a third overlapping part arranged in the second direction; the first overlapping part is located at a side of the first sub-pixel unit away from the second sub-pixel unit, the second overlapping part is located at a side of the second sub-pixel unit away from the third sub-pixel unit, and the third overlapping part is located at a side of the third sub-pixel unit adjacent to the second sub-pixel unit; and wherein in the first direction, a distance from the first overlapping part to the first sub-pixel unit is defined as d1, a distance from the second overlapping part to the second sub-pixel unit is defined as d2, and a distance from the third overlapping part to the third sub-pixel unit is defined as d3; d1 is greater than d2 and d3.

17. The display panel in claim 12, wherein in the second direction, a width of the second shielding line is greater than a width of the first shielding line.

18. The display panel in claim 17, wherein an orthographic projection of the pixel electrode on the substrate overlaps the orthographic projection of the data line on the substrate.

19. The display panel in claim 12, wherein the array substrate further comprises:

a gate insulating layer, covering a side of the common electrode line away from the substrate, wherein the data line is disposed on a side of the gate insulating layer away from the substrate;

an insulating dielectric layer, covering a side of the data line away from the substrate, wherein the second shielding line is disposed on a side of the insulating dielectric layer away from the substrate; and a leveling layer, covering a side of the second shielding line away from the substrate, wherein the first shielding line and the pixel electrode are disposed on a side of the leveling layer away from the data line;

wherein the first shielding line is electrically connected to the common electrode line through a first via hole going through the gate insulating layer, the insulating dielectric layer, and the leveling layer; the second shielding line is electrically connected to the common electrode line through a second via hole going through the gate insulating layer and the insulating dielectric layer.

20. The display panel in claim 19, wherein the insulating dielectric layer comprises:

a passivation layer, covering the side of the data line away from the substrate; and a color filter layer, disposed on a side of the passivation layer away from the substrate and comprising a color filter opening disposed in the second wiring area, wherein the first via hole and the second via hole are located in the color filter opening.

\* \* \* \* \*